(12) United States Patent
Jayatissa

(10) Patent No.: US 6,699,525 B2
(45) Date of Patent: Mar. 2, 2004

(54) METHOD OF FORMING CARBON NANOTUBES AND APPARATUS THEREFOR

(75) Inventor: Ahalapitiya H. Jayatissa, Kalamazoo, MI (US)

(73) Assignee: The Board of Trustees of Western Michigan University, Kalamazoo, MI (US)

( * ) Notice: Subject to any disclaimer, the term of this patent is extended or adjusted under 35 U.S.C. 154(b) by 439 days.

(21) Appl. No.: 09/835,757

(22) Filed: Apr. 16, 2001

(65) Prior Publication Data

US 2002/0150684 A1 Oct. 17, 2002

(51) Int. Cl.⁷ .................... C23C 16/26; C23C 16/46; D01F 9/127
(52) U.S. Cl. .................. 427/249.1; 427/78; 427/206; 427/249.6; 427/255.28; 427/903; 423/447.3; 423/445 B; 118/723 HC; 118/725
(58) Field of Search ............................ 427/77, 78, 206, 427/249.1, 249.3, 249.6, 255.23, 255.28, 402, 903, 249.11; 423/445 R, 445 B, 447.1, 447.3; 118/723 HC, 722, 725, 728

(56) References Cited

U.S. PATENT DOCUMENTS 6,495,258 B1 * 12/2002 Chen et al. ................ 428/408

FOREIGN PATENT DOCUMENTS

WO    WO 99/65821 A1 * 12/1999

OTHER PUBLICATIONS

Ren et al., "Synthesis of Large Arrays of Well–Aligned Carbon Nanotubes on Glass", Science, vol. 282, Nov. 1998, pp. 1105–1107.*

* cited by examiner

Primary Examiner—Shrive P. Beck
Assistant Examiner—Wesley Markham
(74) Attorney, Agent, or Firm—Flynn, Thiel, Boutell & Tanis, P.C.

(57) ABSTRACT

Carbon nanotubes are formed on a substrate by providing a coiled filament in a chemical vapor deposition chamber, supporting a substrate having a catalytic coating provided thereon inside the coiled filament, evacuating air, if present, from the chamber, heating the filament and applying a bias voltage between the filament and the substrate, introducing a reactant gas into the chamber, and pyrolyzing the reactant gas to deposit the carbon nanotubes on the catalytic coating. The substrate can be in the form of a rod or fiber and the carbon nanotubes can be deposited in a radially extending cluster on the substrate. The present invention also contemplates an apparatus for carrying out the inventive method.

12 Claims, 2 Drawing Sheets

METHOD OF FORMING CARBON NANOTUBES AND APPARATUS THEREFOR

FIELD OF THE INVENTION

This invention relates to a method for forming carbon nanotubes and an apparatus for performing the inventive method.

BACKGROUND OF THE INVENTION

Carbon nanotubes are tubules of carbon generally having a length of from 5 to 100 micrometers and a diameter of from 5 to 100 nanometers. Carbon nanotubes are formed from a plurality of co-axial cylinders of graphite sheets and have recently received a great deal of attention for use in different utilities such as fuel cells, fuel emission devices, catalysts, filtration and purification, sensors and microelectro mechanical manufacturing systems (MEMS) technology. Carbon nanotubes have many desirable properties such as a high strength and low weight compared with volume, energy and fuel storage capability, electron emission capability and many advantageous thermal, chemical and surface properties.

A particularly interesting property of carbon nanotubes is that their widths are just large enough to accept hydrogen molecules but too small for larger molecules. As a result, carbon nanotubes have drawn a great deal of attention as storage vehicles for hydrogen and, consequently, for use in fuel cell applications. Although carbon nanotubes have many advantageous properties, successful commercial application of them have not yet been reported due to the difficulty in synthesis capacity, manipulation and structural controllability of the carbon nanotubes. Therefore, there is a need for a method and apparatus which enables the synthesis of uniform carbon nanotubes in a cost effective and easily controllable method.

SUMMARY OF THE INVENTION

The present invention provides a method and apparatus for forming densely packed carbon nanotubes by a batch process. The carbon nanotubes can be formed in a high-density, close-packed configuration to enable large-scale production.

The present invention meets the needs outlined above by providing a method and apparatus for forming densified carbon nanotubes in which a chemical vapor deposition chamber having a coiled filament disposed therein is provided, a substrate having a catalytic coating provided thereon is supported inside the coiled filament, air is evacuated, if present, from the chamber, the filament is heated and a bias voltage applied between it and the substrate, a reactant gas is introduced into the chamber and the reactant gas is pyrolyzed to deposit carbon nanotubes on the substrate. When a cylindrical substrate is utilized, the carbon nanotubes can be aligned perpendicular to the longitudinal axis of the substrate and the radial growth of the carbon nanotubes allows for the formation of a densely packed configuration of the carbon nanotubes.

DETAILED DESCRIPTION OF THE INVENTION

Figure 1:
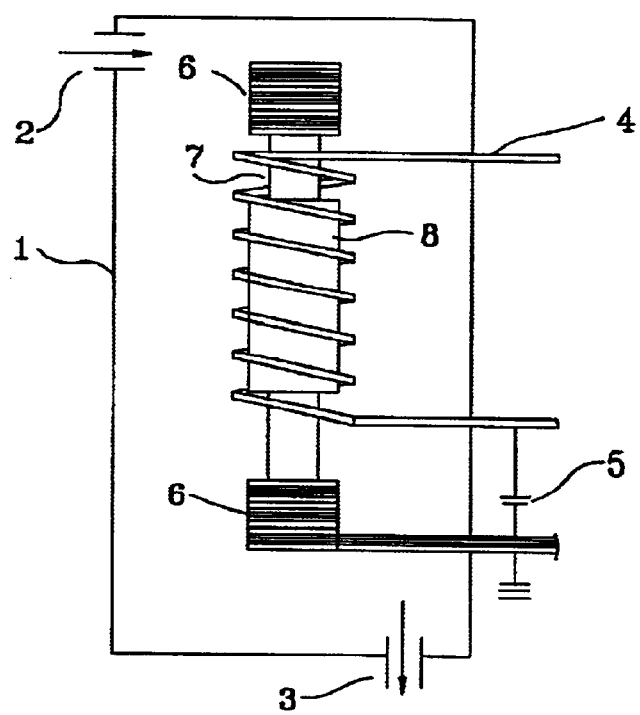
FIG. 1 is a schematic representation of an apparatus of the present invention used for forming carbon nanotubes on a single substrate.

As illustrated in FIG. 1, the apparatus of the present invention comprises a conventional chemical vapor deposition chamber 1, which is formed from an inert material, such as quartz, and provided with a gas inlet 2 and a gas outlet 3. The chemical vapor deposition chamber 1 has a coiled filament 4 provided therein. The coiled filament can be formed from a suitable metal, such as tungsten, molybdenum, and alloys thereof, and carbon. The coiled filament 4 can be heated by a means for heating the filament (not shown) and is also in electrical communication with a bias voltage source 5.

A substrate holder 6 also is provided in the chemical vapor deposition chamber 1 and is located in the chamber 1 in such a manner that a substrate 7 held by the holder 6 is disposed within the coils of the coiled filament 4. The substrate holder 6 also is electrically connected to the bias voltage source 5 so that a bias voltage exists between the coiled filament and the substrate holder. In the embodiments shown in FIGS. 1 and 2, the substrate 7 has the form of a cylindrical rod and is held at its ends by the substrate holder 6.

The substrate material is not critical and can be a metal, ceramic or carbon as long as it is stable at the high temperatures it is exposed to. Electrically conductive materials or materials having an electrically conductive layer provided thereon are particularly preferred due to the bias voltage applied thereto. Additionally, the configuration of the substrate 7 is also not critical and the substrate can be provided in the form of a rod, fiber or any other desirable shape. A catalytic metal coating 8 is provided on the substrate 7 to aid in the growth of the carbon nanotubes 9. The loading of the catalytic coating on the substrate is preferably in an amount of 5–100 $\mu g/cm^2$, more preferably 10–30 $\mu g/cm^2$. The catalytic coating can contain iron, cobalt, chromium, nickel, paladium, titanium and alloys thereof as the active ingredient and can be deposited on the substrate by any suitable deposition method such as electrochemical deposition, chemical deposition, electro-oxidation, electroplating, sputtering, thermal diffusion and evaporation, physical vapor deposition, sol-gel deposition and chemical vapor deposition.

Figure 2:
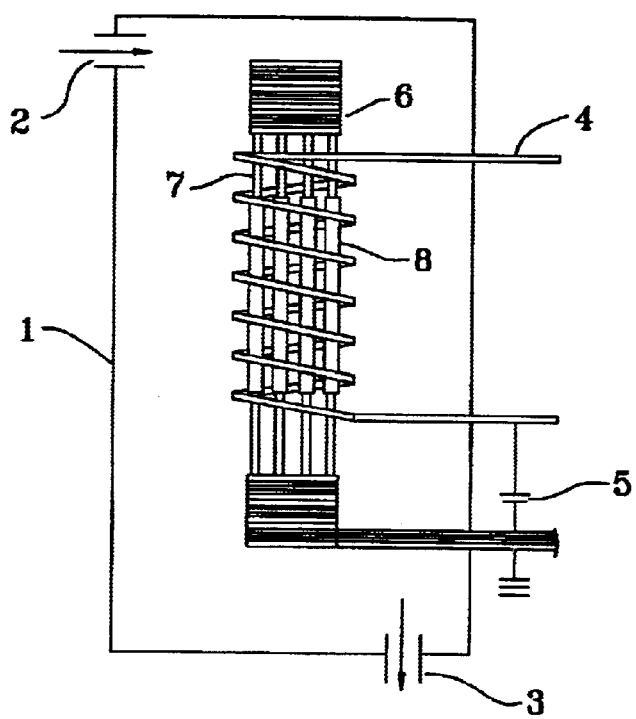
FIG. 2 is a schematic representation of an apparatus of the present invention used for forming carbon nanotubes on multiple substrates.

In actual operation, the present invention functions as follows. Referring to FIGS. 1 and 2, a chemical vapor deposition chamber 1 is provided having a gas inlet 2 and a gas outlet 3. A coiled filament 4 and substrate holder 6 are contained in the chemical vapor deposition chamber 1. A bias voltage source 5 is connected to both the coiled filament and the substrate holder in order that a bias voltage can be established therebetween. Preferably, a bias voltage range of from 50–200 V/cm is utilized. A substrate 7 having a catalytic metal coating 8 provided thereon is held by the substrate holder 6 in such a fashion that the substrate 7 is contained within the coils of the coiled filament 4.

Air is evacuated from the chamber 1 by either forming a vacuum in the chamber or displacement of air by an inert gas and then the chamber is heated to a temperature of between 600–900° C. by heating the coiled filament 4 by any suitable means, such as passing an electrical current therethrough. The substrate can be heated to a temperature of from 650–900° C. Ammonia gas is then introduced into the chamber 1 through the gas inlet 2 and circulated therein for about 5–30 minutes in order to activate the catalytic coating 8. The ammonia gas is then withdrawn through the gas outlet 3 and a reactant gas, such as acetylene, ethylene and mixtures thereof, introduced into the chamber 1 through the inlet 2. The reactant gas can be mixed with other gases such as hydrogen and argon. Acetylene is particularly preferred as the reactant gas and is pyrolyzed in the chamber to deposit carbon nanotubes 9 on the catalytic coating 8 on the substrate 7. The flow rate of the reactant gas is from 2–50 sccm, depending on the vacuum systems and the pressure in the chamber during the deposition process is preferably from 1–100 Torr, with a pressure of from 1–20 Torr being more preferred.

Figure 3:
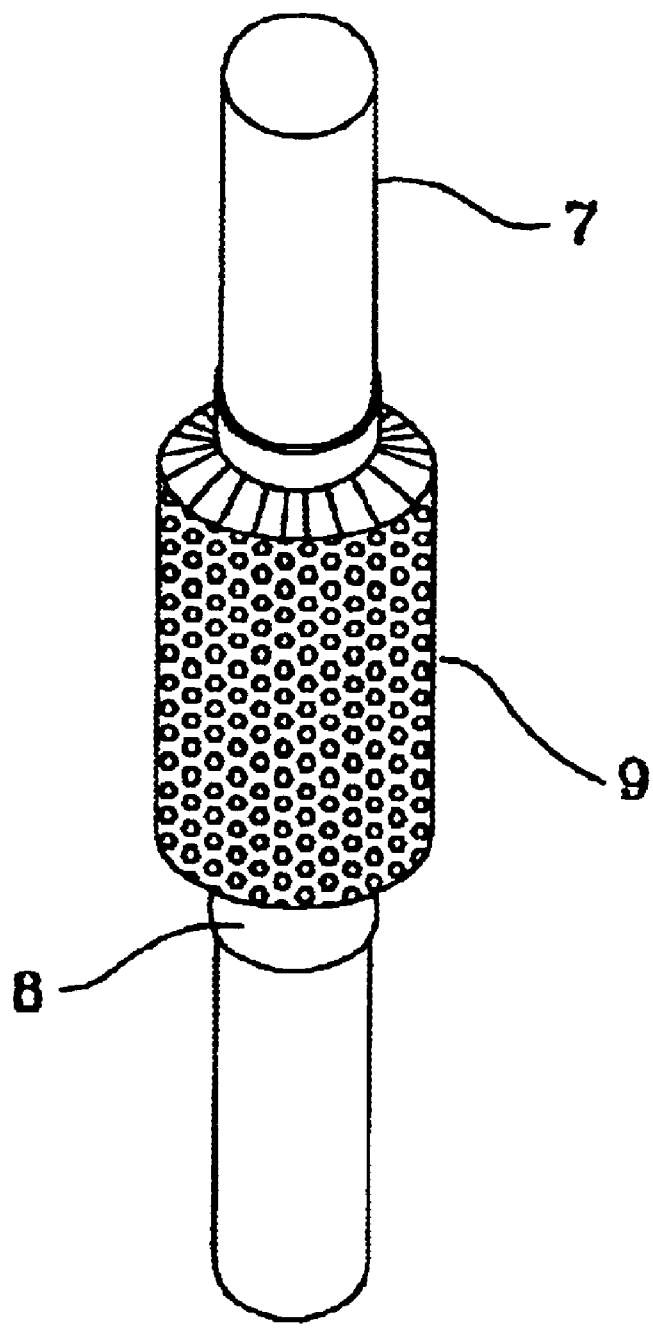
FIG. 3 is an illustration of a cylindrical substrate having carbon nanotubes originally deposited thereon according to the present invention.

If the substrate 7 is in the form of a cylinder or fiber and a bias voltage is applied between the substrate holder 6 and the coiled filament 4, the carbon nanotubes 9 grow radially on the catalytic coating 8 of the substrate 7 as shown in FIG. 3. As illustrated in FIG. 3, the carbon nanotubes produced by the present invention are densely packed and can be easily separated from the substrate without damage thereto.

Although specific embodiments of the present invention have been disclosed for illustration purposes only, it is understood that various changes, substitutions and alterations can be made thereto without departing from the spirit and scope of the invention as is described by the following claims.

What is claimed is:

1. A method of forming carbon nanotubes on a substrate comprising the steps of:

providing a chemical vapor deposition chamber having a coiled filament disposed therein;

supporting a substrate having a catalytic coating provided thereon inside the coiled filament;

evacuating air, if present, from the chamber;

heating the filament and applying a bias voltage between the filament and the substrate;

introducing a reactant gas into said chamber; and pyrolyzing the reactant gas to deposit carbon nanotubes on the substrate.

2. The method of claim 1, wherein the reactant gas comprises at least one member selected from the group consisting of acetylene, ethylene and mixtures thereof.

3. The method of claim 1, additionally comprising the step of introducing ammonia gas into said chamber to activate the catalytic coating.

4. The method of claim 1, wherein the substrate is in the form of a rod.

5. The method of claim 4, wherein the carbon nanotubes are grown in a radial direction of the rod.

6. The method of claim 1, wherein the substrate is in the form of a fiber.

7. The method of claim 1, wherein said catalytic coating is selected from the group consisting of cobalt, nickel, iron, chromium and alloys thereof.

8. The method of claim 1, wherein the carbon nanotubes are grown in an orthogonal direction to a longitudinal axis of the substrate.

9. The method of claim 1, wherein the substrate is made of at least one material selected from the group consisting of carbon, a metal and a ceramic.

10. The method of claim 1, wherein air is evacuated from the chamber by forming a vacuum in the chamber.

11. The method of claim 1, wherein air is evacuated from the chamber by displacement with an inert gas.

12. The method of claim 1, wherein the substrate is heated to a temperature of from 650–900° C.

* * * * *